United States Patent
Liu et al.

(10) Patent No.: US 10,797,185 B2
(45) Date of Patent: Oct. 6, 2020

(54) FRONT-SIDE CONDUCTIVE PASTE FOR CRYSTALLINE SILICON SOLAR CELL, PREPARATION METHOD THEREFOR, AND SOLAR CELL

(71) Applicant: Soltrium Advanced Materials Technology, Ltd Shenzhen, Shenzhen (CN)

(72) Inventors: Xiaoli Liu, JiaXing (CN); Fengzhen Sun, JiaXing (CN); Yu Li, JiaXing (CN); Delin Li, San Jose, CA (US)

(73) Assignee: Soltrium Corp., Shenzhen ( * ) Notice: Subject to any disclaimer, the term of this patent is extended or adjusted under 35 U.S.C. 154(b) by 123 days.

(21) Appl. No.: 16/254,977

(22) Filed: Jan. 23, 2019

(65) Prior Publication Data
US 2019/0305150 A1    Oct. 3, 2019

Related U.S. Application Data

(63) Continuation-in-part of application No. PCT/CN2018/081375, filed on Mar. 30, 2018.

(51) Int. Cl.
*H01B 1/22* (2006.01)
*B05D 5/12* (2006.01)
(Continued)

(52) U.S. Cl.
CPC ........ *H01L 31/022425* (2013.01); *B05D 5/12* (2013.01); *B22F 1/0074* (2013.01);
(Continued)

(58) Field of Classification Search
CPC .... H01B 1/16; B05D 5/12; C03C 3/07; C03C 3/102
See application file for complete search history.

(56) References Cited

U.S. PATENT DOCUMENTS 5,281,561 A * 1/1994 Dumesnil ............ C03C 3/0745
501/15
8,497,420 B2   7/2013 Carroll et al.
(Continued)

FOREIGN PATENT DOCUMENTS

WO   WO 2013109583 A3 *  7/2013

*Primary Examiner* — Mark Kopec
(74) *Attorney, Agent, or Firm* — Fang Wu

(57) ABSTRACT

A front-side conductive paste for a crystalline silicon solar cell is provided. The front-side conductive paste for a crystalline silicon solar cell includes, in parts by weight, 80.0-93.0 parts of a metal powder, 6.0-15.0 parts of an organic carrier, and 1.0-5.0 parts of an oxide etching agent, where based on 100% by mole of the oxide etching agent, the oxide etching agent includes 15-30% of PbO; 25-40% of $TeO_2$; 8.0-15.0% of $Li_2O$; 9.0-20.0% of $SiO_2$; 5.0-15.0% of $Bi_2O_3$; 0.5-10.0% of ZnO; and either one or both of 0.1-10.0% of MgO and 0.1-10.0% of CaO; and no more than 5.0% of an oxide of additional metal elements. The metal powder forms good ohmic contact with crystalline silicon substrate during the sintering process of the front-side conductive paste applied overlying an insulation film on the substrate. Finally, a front-side electrode of low contact resistance, good electrical conductivity, and strong adhesion is obtained.

13 Claims, 5 Drawing Sheets

(51) Int. Cl.
  *H01L 31/0224* (2006.01)
  *H01L 31/068* (2012.01)
  *H01L 31/18* (2006.01)
  *B41M 3/00* (2006.01)
  *B41M 7/00* (2006.01)
  *B22F 1/00* (2006.01)
  *H01L 31/0216* (2014.01)

(52) U.S. Cl.
  CPC ............ *B41M 3/006* (2013.01); *B41M 7/009* (2013.01); *H01B 1/22* (2013.01); *H01L 31/068* (2013.01); *H01L 31/18* (2013.01); *B22F 2301/255* (2013.01); *B22F 2302/25* (2013.01); *H01L 31/02168* (2013.01)

(56) References Cited

U.S. PATENT DOCUMENTS

| | | |
|---|---|---|
| 8,889,980 B2 | 11/2014 | Carroll et al. |
| 8,895,843 B2 | 11/2014 | Carroll et al. |
| 9,722,100 B2 | 8/2017 | Carroll et al. |
| 10,069,020 B2 | 9/2018 | Carroll et al. |
| 10,658,090 B2 * | 5/2020 | Zhang ...................... H01B 1/22 |
| 2016/0013331 A1 * | 1/2016 | Park .......................... C03C 8/02 |
| | | 136/256 |

* cited by examiner

FRONT-SIDE CONDUCTIVE PASTE FOR CRYSTALLINE SILICON SOLAR CELL, PREPARATION METHOD THEREFOR, AND SOLAR CELL

CROSS-REFERENCES TO RELATED APPLICATIONS

This application is a continuation in part of and claims priority to PCT Patent Application No. PCT/CN2018/081375, filed on Mar. 30, 2018, commonly assigned and incorporated by reference herein to its entirety for all purposes.

BACKGROUND OF THE INVENTION

The present invention relates to the technical field of solar cells, and particularly, to a front-side conductive paste for a crystalline silicon solar cell, a preparation method therefor, and a solar cell.

Solar energy is an inexhaustible and clean energy source. With the depletion of non-renewable energy sources such as coal and petroleum, the development and utilization of solar energy has become a hot spot. Solar cells developed based on this idea are an important means of utilizing solar energy. At present, the industrialized crystalline silicon solar cell has become a model for use of solar cells.

Cell chip is a core component in the crystalline silicon solar cell. In order to collect and guide the current generated under illumination, an electrode needs to be fabricated respectively on each of a front side and a back side of the cell chip. There are various methods available for manufacturing electrodes. Among them, screen printing and co-sintering are a currently most common production process. For example, in the manufacture of front-side electrodes, a conductive paste is applied to a silicon cell chip by screen printing, and a front-side electrode is formed on the front side of the silicon cell chip by sintering. The sintered front-side electrode of the crystalline silicon solar cell needs to be firmly adhered onto the silicon cell chip, has narrow and high grid lines and small light shielding area, and is easy to be soldered. The conductive paste for the front-side electrode of the silicon solar cell is required to have the ability to penetrate a silicon nitride anti-reflective film during the sintering process, to form a good ohmic contact with the silicon cell chip.

A common front-side conductive paste for the crystalline silicon solar cell contains a silver powder, a glass powder, and an organic carrier, and the conductive paste is sintered to form a front-side electrode. During the sintering process, an oxide etching agent in the conductive paste etches and penetrates an anti-reflective insulating layer such as silicon nitride, titanium oxide, aluminum oxide, silicon oxide, or silicon oxide/titanium oxide on the front side or the side of irradiation of the crystalline silicon solar cell, so that the silver powder is brought into contact with the substrate of the crystalline silicon solar cell to form a front-side electrode. As the sheet resistance of the solar cell increases, the conventional front-side conductive paste and the glass powder used cannot well etch the anti-reflective insulating layer on the surface of the silicon solar cell chip, and the contact resistance between the front-side electrode formed and the surface of the silicon solar cell chip is high, thus affecting the photoelectric conversion efficiency of the silicon solar cell chip.

BRIEF SUMMARY OF THE INVENTION

The technical problem to be solved by the present invention is to provide a front-side conductive paste for a crystalline silicon solar cell and a preparation method therefor, to solve the problem that the existing front-side conductive paste cannot effectively etch the anti-reflective insulating layer on a surface of a silicon chip of the solar cell, causing an increased contact resistance between the front-side electrode and the surface of the silicon chip, and finally a lowered photoelectric conversion efficiency of the silicon chip.

Further, the present invention also provides a method for fabricating a front-side electrode of a crystalline silicon solar cell and a silicon solar cell having the front-side electrode. To achieve the above object, the following technical solution is adopted in the present invention.

In an aspect, the present disclosure provides a front-side conductive paste for a crystalline silicon solar cell. The conductive paste includes, based on 100 parts by weight, metal powder 80.0-93.0 parts, organic carrier 6.0-15.0 parts, and oxide etching agent 1.0-5.0 parts. Additionally, based on 100% by mole of the oxide etching agent, the oxide etching agent includes 15-30% of PbO; 25-40% of $TeO_2$; 8.0-15.0% of $Li_2O$; 9.0-20.0% of $SiO_2$; 5.0-15.0% of $Bi_2O_3$; 0.5-10.0% of ZnO, and either one or both of 0.1-10.0% of MgO and 0.1-10.0% of CaO. Optionally, the conductive paste further includes no more than 5.0% of an oxide of an additional oxide element including titanium, aluminum, silver, chromium, scandium, copper, niobium, vanadium, sodium, tantalum, strontium, bromine, cobalt, hafnium, lanthanum, yttrium, ytterbium, iron, barium, manganese, tungsten, nickel, tin, arsenic, zirconium, potassium, phosphorus, indium, gallium, and germanium.

In another aspect, the present disclosure provides a method for preparing a front-side conductive paste for a crystalline silicon solar cell. The method includes a step of melting raw material components of an oxide etching agent to obtain a melted oxide etching agent, a step of quenching the melt to obtain a particulate oxide etching agent, and a step of crushing to obtain a powdered oxide etching agent having a particle size ranging from 0.1 to 5.0 Additionally, the method includes a step of mixing raw materials of an organic carrier in an environment of 40-100° C., to obtain the organic carrier. Furthermore, the method includes a step of mixing a metal powder with the powdered oxide etching agent and the organic carrier, to obtain a front-side conductive paste for a crystalline silicon solar cell.

In yet another aspect, the present disclosure provides a method for fabricating a front-side electrode of a crystalline silicon solar cell. The method includes at least the steps of providing a crystalline silicon substrate having an insulating film overlaid on its surface, printing a front-side conductive paste for a crystalline silicon solar cell as described above on a surface of the insulating film, then drying, sintering, and cooling to obtain a front-side electrode of a crystalline silicon solar cell.

In addition, a crystalline silicon solar cell is provided. The crystalline silicon solar cell has a front-side electrode of a crystalline silicon solar cell as described above. The crystalline silicon solar cell includes a crystalline silicon substrate and at least one insulation film overlaid on the crystalline silicon substrate. The crystalline silicon solar cell further includes a front-side electrode in contact with the at least one insulation film and in electrical contact with the crystalline silicon substrate with a square resistance more than 90 ohms. Furthermore, the front-side electrode includes an electrically conductive metal powder, metal oxides of Pb, Te, Li, Bi, Si, Bi, and at least 0.5-10% ZnO, and either one or both of 0.1-10% MgO and 0.1-10% CaO based on 100% mole of the metal oxides.

Compared with the prior art, the front-side conductive paste for a crystalline silicon solar cell provided in the present invention has the following advantages. The oxide etching agent contains components of particular ratios, and these components of particular ratios exhibit excellent dissolving and etching properties. Therefore, the oxide etching agent can dissolve a sufficient amount of silver during the sintering process. One portion of the liquid oxide etching agent in which the silver is dissolved is used to wet the metal powder and facilitate the sintering of the metal powder. The other portion flows to the surface of the solar cell and reacts with the anti-reflective layer, so that the anti-reflective layer is effectively etched. During the cooling process, the silver dissolved in the liquid oxide etching agent is precipitated out to form fine silver nanoparticles, which allows the metal powder to form a good ohmic contact with silicon, thus greatly reducing the resistance of the front-side electrode. Finally, a front-side electrode with low contact resistance, good electrical conductivity and strong adhesion is obtained.

The method for preparing a front-side conductive paste for a crystalline silicon solar cell provided in the present invention has simple process conditions, and the obtained front-side conductive paste has uniform components and good performance, and is suitable for mass industrial production.

The method for preparing a front-side electrode of a crystalline silicon solar cell provided in the present invention has the following advantages. The front-side conductive paste for a crystalline silicon solar cell provided above is employed, and the oxide etching agent can dissolve a sufficient amount of silver during the sintering process. One portion of the liquid oxide etching agent in which the silver is dissolved is used to wet the metal powder and facilitate the sintering of the metal powder. The other portion flows to the surface of the solar cell and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the resistance. In this way, a front-side electrode with low contact resistance, good electrical conductivity and strong adhesion is formed.

Since the crystalline silicon solar cell provided in the invention includes employing the above-mentioned front-side electrode structure of a crystalline silicon solar cell, the solar cell structure exhibits good adhesion; and the silver electrode has good ohmic contact with the silicon chip of the solar cell, so that the conversion efficiency of the solar cell is improved.

Figure 1:
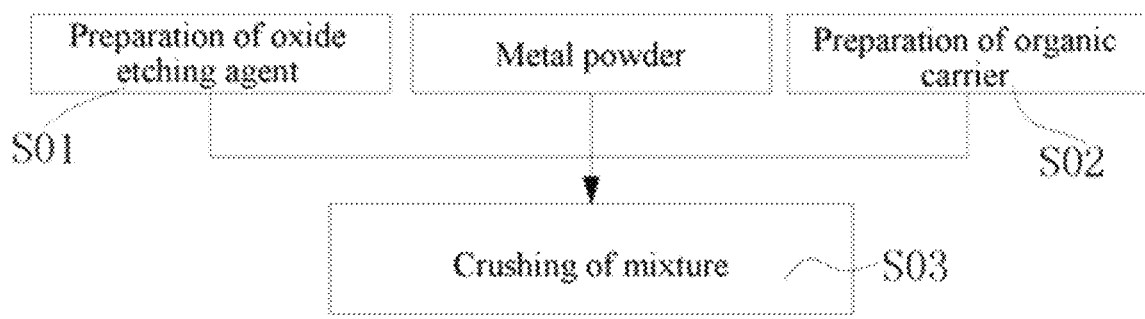
FIG. 1 is a schematic flowchart of a method for preparing a front-side conductive paste for a crystalline silicon solar cell provided in the present disclosure.

In the figures, 100-crystalline silicon substrate; 101-a first surface of the substrate; 102-a second surface of the substrate; 200-P/N junction layer; 300-insulating film; 400-printed front-side conductive paste, 401-metal powder, 402-organic carrier, 403-oxide etching agent; 500-printed back-side silver paste; 600-printed back-side aluminum paste; 700-front-side electrode; 800-solder strip; 900-tensile tester; 901-first fixing bolt for tensile sample; 902-second fixing bolt for tensile sample; F-direction of tensile force.

DETAILED DESCRIPTION OF THE INVENTION

To make the technical problem to be solved, the technical solution, and the beneficial effects of the present invention clearer, the present invention is further described in detail with reference to examples and accompanying drawings. It should be understood that the specific examples described herein are merely provided for illustrating, instead of limiting the present invention.

In the present invention, three parallel technical solutions are involved, which are specifically as follows:

A first solution is provided in the present invention. A front-side conductive paste for a crystalline silicon solar cell includes, based on 100 parts by weight, metal powder of 80.0-93.0 parts, organic carrier of 6.0-15.0 parts, and oxide etching agent of 1.0-5.0 parts. Optionally, the metal powder of 80.0-83.0 parts is used. Optionally, the metal powder of 83.0-86.0 parts is used. Optionally, the metal powder of 86.0-89.0 parts is used. Optionally, the metal powder of 89.0-91.5 parts is used. Optionally, the metal powder of 91.5-93.0 parts is used. Optionally, the organic carrier of 6.0-7.0 parts is used. Optionally, the organic carrier of 7.0-8.5 parts is used. Optionally, the organic carrier of 8.5-10.0 parts is used. Optionally, the organic carrier of 10.0-11.0 parts is used. Optionally, the organic carrier of 11.0-12.0 parts is used. Optionally, the organic carrier of 12.0-13.0 parts is used. Optionally, the organic carrier of 13.0-15.0 parts is used. Optionally, the oxide etching agent of 1.0-2.0 parts is used. Optionally, the oxide etching agent of 2.0-3.0 parts is used. Optionally, the oxide etching agent of 3.0-4.0 parts is used. Optionally, the oxide etching agent of 4.0-5.0 parts is used. Optionally, based on 100% by mole of the oxide etching agent, the oxide etching agent includes at least 0.1-10% of MgO, 15-30% of PbO, 25-40% of TeO, 8-15% of $Li_2O$, 0.1-10% of CaO, and 5-15% of $Bi_2O_3$. More specifically, based on 100% by mole of the oxide etching agent, the oxide etching agent includes: PbO 15-30%; $TeO_2$ 25-40%; $Li_2O$ 8.0-15.0%; $SiO_2$ 9.0-20.0%; $Bi_2O_3$ 5.0-15.0%; MgO 0.1-10.0%; ZnO 0.5-10.0%; CaO 0.1-10.0%; and oxide of additional elements 0-5.0%. Optionally, the oxide etching agent based on 100% by mole includes 15-17% of PbO. Optionally, the oxide etching agent based on 100% by mole includes 17-20% of PbO. Optionally, the oxide etching agent based on 100% by mole includes 20-24% of PbO. Optionally, the oxide etching agent based on 100% by mole includes 24-26% of PbO. Optionally, the oxide etching agent based on 100% by mole includes 26-28% of PbO. Optionally, the oxide etching agent based on 100% by mole includes 28-30% of PbO. Optionally, the oxide etching agent based on 100% by mole includes 25-30% of $TeO_2$. Optionally, the oxide etching agent based on 100% by mole includes 30-33% of $TeO_2$. Optionally, the oxide etching agent based on 100% by mole includes 33-36% of $TeO_2$. Optionally, the oxide etching agent based on 100% by mole includes 36-38% of $TeO_2$. Optionally, the oxide etching agent based on 100% by mole includes 38-40% of $TeO_2$. Optionally, the oxide etching agent based on 100% by mole includes 8-9% of $Li_2O$. Optionally, the oxide etching agent based on 100% by mole includes 9-10% of $Li_2O$. Optionally, the oxide etching agent based on 100% by mole includes 10-11% of $Li_2O$. Optionally, the oxide etching agent based on 100% by mole includes 11-12% of $Li_2O$. Optionally, the oxide etching agent based on 100% by mole includes 12-13% of $Li_2O$. Optionally, the oxide etching agent based on 100% by mole includes 13-14% of $Li_2O$. Optionally, the oxide etching agent based on 100% by mole includes 14-15% of $Li_2O$. Optionally, the oxide etching agent based on 100% by mole includes 9-11% of $SiO_2$. Optionally, the oxide etching agent based on 100% by mole includes 11-13% of $SiO_2$. Optionally, the oxide etching agent based on 100% by mole includes 13-15% of $SiO_2$. Optionally, the oxide etching agent based on 100% by mole includes 15-16% of $SiO_2$. Optionally, the oxide etching agent based on 100% by mole includes 16-18% of $SiO_2$. Optionally, the oxide etching agent based on 100% by mole includes 18-20% of $SiO_2$. Optionally, the oxide etching agent based on 100% by mole includes 5-6% of $Bi_2O_3$. Optionally, the oxide etching agent based on 100% by mole includes 6-8% of $Bi_2O_3$. Optionally, the oxide etching agent based on 100% by mole includes 8-10% of $Bi_2O_3$. Optionally, the oxide etching agent based on 100% by mole includes 10-12% of $Bi_2O_3$. Optionally, the oxide etching agent based on 100% by mole includes 12-14% of $Bi_2O_3$. Optionally, the oxide etching agent based on 100% by mole includes 14-15% of $Bi_2O_3$. Optionally, the oxide etching agent based on 100% by mole includes 0.1-0.2% of MgO. Optionally, the oxide etching agent based on 100% by mole includes 0.2-0.4% of MgO. Optionally, the oxide etching agent based on 100% by mole includes 0.4-0.6% of MgO. Optionally, the oxide etching agent based on 100% by mole includes 0.6-1.0% of MgO. Optionally, the oxide etching agent based on 100% by mole includes 1.0-2.0% of MgO. Optionally, the oxide etching agent based on 100% by mole includes 2.0-4.0% of MgO. Optionally, the oxide etching agent based on 100% by mole includes 4.0-6.0% of MgO. Optionally, the oxide etching agent based on 100% by mole includes 6.0-10.0% of MgO. Optionally, the oxide etching agent based on 100% by mole includes 0.5-0.6% of ZnO. Optionally, the oxide etching agent based on 100% by mole includes 0.6-0.8% of ZnO. Optionally, the oxide etching agent based on 100% by mole includes 0.8-1.1% of ZnO. Optionally, the oxide etching agent based on 100% by mole includes 1.1-2.2% of ZnO. Optionally, the oxide etching agent based on 100% by mole includes 2.2-3.3% of ZnO. Optionally, the oxide etching agent based on 100% by mole includes 3.3-5.0% of ZnO. Optionally, the oxide etching agent based on 100% by mole includes 5.0-6.5% of ZnO. Optionally, the oxide etching agent based on 100% by mole includes 6.5-7.5% of ZnO. Optionally, the oxide etching agent based on 100% by mole includes 7.5-8.6% of ZnO. Optionally, the oxide etching agent based on 100% by mole includes 8.6-10.0% of ZnO. Optionally, the oxide etching agent based on 100% by mole includes 0.1-0.2% of CaO. Optionally, the oxide etching agent based on 100% by mole includes 0.2-0.3% of CaO. Optionally, the oxide etching agent based on 100% by mole includes 0.3-0.5% of CaO. Optionally, the oxide etching agent based on 100% by mole includes 0.5-0.7% of CaO. Optionally, the oxide etching agent based on 100% by mole includes 0.7-1.0% of CaO. Optionally, the oxide etching agent based on 100% by mole includes 1.0-2.2% of CaO. Optionally, the oxide etching agent based on 100% by mole includes 2.2-3.5% of CaO. Optionally, the oxide etching agent based on 100% by mole includes 3.5-5.0% of CaO. Optionally, the oxide etching agent based on 100% by mole includes 5.0-6.5% of CaO. Optionally, the oxide etching agent based on 100% by mole includes 6.5-7.5% of CaO. Optionally, the oxide etching agent based on 100% by mole includes 7.5-9.0% of CaO. Optionally, the oxide etching agent based on 100% by mole includes 9.0-10.0% of CaO.

In the first solution of the present invention, MgO and $Li_2O$, CaO and $Li_2O$, and MgO and CaO are all present at a particular molar ratio in the oxide etching agent, and specifically MgO:$Li_2O$=0.1:15-10:8, CaO:$Li_2O$=0.1:15-10:8, and MgO:CaO=0.1:10-10:0.1. The oxide etching agent is melted to form a liquid during the sintering process, so that a sufficient amount of silver is dissolved therein. One portion of the liquid oxide etching agent in which the silver is dissolved is used to wet the metal powder and facilitate the sintering of the metal powder. The other portion of the liquid oxide etching agent in which the silver is dissolved flows to the surface of the solar cell and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the resistance. In this way, a front-side electrode with low contact resistance, good electrical conductivity and strong adhesion is formed.

A second solution is provided in the present invention. A front-side conductive paste for a crystalline silicon solar cell includes, based on 100 parts by weight, metal powder 80.0-93.0 parts; organic carrier 6.0-15.0 parts; and oxide etching agent 1.0-5.0 parts. Optionally, the metal powder of 80.0-83.0 parts is used. Optionally, the metal powder of 83.0-86.0 parts is used. Optionally, the metal powder of 86.0-89.0 parts is used. Optionally, the metal powder of 89.0-91.5 parts is used. Optionally, the metal powder of 91.5-93.0 parts is used. Optionally, the organic carrier of 6.0-7.0 parts is used. Optionally, the organic carrier of 7.0-8.5 parts is used. Optionally, the organic carrier of 8.5-10.0 parts is used. Optionally, the organic carrier of 10.0-11.0 parts is used. Optionally, the organic carrier of 11.0-12.0 parts is used. Optionally, the organic carrier of 12.0-13.0 parts is used. Optionally, the organic carrier of 13.0-15.0 parts is used. Optionally, the oxide etching agent of 1.0-2.0 parts is used. Optionally, the oxide etching agent of 2.0-3.0 parts is used. Optionally, the oxide etching agent of 3.0-4.0 parts is used. Optionally, the oxide etching agent of 4.0-5.0 parts is used. Optionally, based on 100% by mole of the oxide etching agent, the oxide etching agent includes at least 0.1-10% of MgO, 15-30% of PbO, $TeO_2$ 25-40%, 8-15% of $Li_2O$, and 5-15% of $Bi_2O_3$. More specifically, based on 100% by mole of the oxide etching agent, the oxide etching agent includes: PbO 15-30%; $TeO_2$ 25-40%; $Li_2O$ 8.0-15.0%; $SiO_2$ 9.0-20.0%; $Bi_2O_3$ 5.0-15.0%; MgO 0.5-10.0%; ZnO 0.5-10.0%; and oxide of additional elements 0-5.0%. Optionally, the oxide etching agent based on 100% by mole includes 15-17% of PbO. Optionally, the oxide etching agent based on 100% by mole includes 17-20% of PbO. Optionally, the oxide etching agent based on 100% by mole includes 20-24% of PbO. Optionally, the oxide etching agent based on 100% by mole includes 24-26% of PbO. Optionally, the oxide etching agent based on 100% by mole includes 26-28% of PbO. Optionally, the oxide etching agent based on 100% by mole includes 28-30% of PbO. Optionally, the oxide etching agent based on 100% by mole includes 25-30% of $TeO_2$. Optionally, the oxide etching agent based on 100% by mole includes 30-33% of $TeO_2$. Optionally, the oxide etching agent based on 100% by mole includes 33-36% of $TeO_2$. Optionally, the oxide etching agent based on 100% by mole includes 36-38% of $TeO_2$. Optionally, the oxide etching agent based on 100% by mole includes 38-40% of $TeO_2$. Optionally, the oxide etching agent based on 100% by mole includes 8-9% of $Li_2O$. Optionally, the oxide etching agent based on 100% by mole includes 9-10% of $Li_2O$. Optionally, the oxide etching agent based on 100% by mole includes 10-11% of $Li_2O$. Optionally, the oxide etching agent based on 100% by mole includes 11-12% of $Li_2O$. Optionally, the oxide etching agent based on 100% by mole includes 12-13% of $Li_2O$. Optionally, the oxide etching agent based on 100% by mole includes 13-14% of $Li_2O$. Optionally, the oxide etching agent based on 100% by mole includes 14-15% of $Li_2O$. Optionally, the oxide etching agent based on 100% by mole includes 9-11% of $SiO_2$. Optionally, the oxide etching agent based on 100% by mole includes 11-13% of $SiO_2$. Optionally, the oxide etching agent based on 100% by mole includes 13-15% of $SiO_2$. Optionally, the oxide etching agent based on 100% by mole includes 15-16% of $SiO_2$. Optionally, the oxide etching agent based on 100% by mole includes 16-18% of $SiO_2$. Optionally, the oxide etching agent based on 100% by mole includes 18-20% of $SiO_2$. Optionally, the oxide etching agent based on 100% by mole includes 5-6% of $Bi_2O_3$. Optionally, the oxide etching agent based on 100% by mole includes 6-8% of $Bi_2O_3$. Optionally, the oxide etching agent based on 100% by mole includes 8-10% of $Bi_2O_3$. Optionally, the oxide etching agent based on 100% by mole includes 10-12% of $Bi_2O_3$. Optionally, the oxide etching agent based on 100% by mole includes 12-14% of $Bi_2O_3$. Optionally, the oxide etching agent based on 100% by mole includes 14-15% of $Bi_2O_3$. Optionally, the oxide etching agent based on 100% by mole includes 0.5-0.6% of MgO. Optionally, the oxide etching agent based on 100% by mole includes 0.6-0.7% of MgO. Optionally, the oxide etching agent based on 100% by mole includes 0.7-0.9% of MgO. Optionally, the oxide etching agent based on 100% by mole includes 0.9-1.0% of MgO. Optionally, the oxide etching agent based on 100% by mole includes 1.0-2.0% of MgO. Optionally, the oxide etching agent based on 100% by mole includes 2.0-4.0% of MgO. Optionally, the oxide etching agent based on 100% by mole includes 4.0-6.0% of MgO. Optionally, the oxide etching agent based on 100% by mole includes 6.0-10.0% of MgO. Optionally, the oxide etching agent based on 100% by mole includes 0.5-0.6% of ZnO. Optionally, the oxide etching agent based on 100% by mole includes 0.6-0.8% of ZnO. Optionally, the oxide etching agent based on 100% by mole includes 0.8-1.1% of ZnO. Optionally, the oxide etching agent based on 100% by mole includes 1.1-2.2% of ZnO. Optionally, the oxide etching agent based on 100% by mole includes 2.2-3.3% of ZnO. Optionally, the oxide etching agent based on 100% by mole includes 3.3-5.0% of ZnO. Optionally, the oxide etching agent based on 100% by mole includes 5.0-6.5% of ZnO. Optionally, the oxide etching agent based on 100% by mole includes 6.5-7.5% of ZnO. Optionally, the oxide etching agent based on 100% by mole includes 7.5-8.6% of ZnO. Optionally, the oxide etching agent based on 100% by mole includes 8.6-10.0% of ZnO.

In the second solution of the present invention, MgO and $Li_2O$, and MgO and $Bi_2O_3$ are both present at a particular molar ratio in the oxide etching agent, and specifically $MgO:Li_2O=0.5:15-10:8$, and $MgO:Bi_2O_3=0.5:12-10:5$. The oxide etching agent is melted to form a liquid during the sintering process, so that a sufficient amount of silver is dissolved therein. One portion of the liquid oxide etching agent in which the silver is dissolved is used to wet the metal powder and facilitate the sintering of the metal powder. The other portion of the liquid oxide etching agent in which the silver is dissolved flows to the surface of the solar cell and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the resistance. In this way, a front-side electrode with low contact resistance, good electrical conductivity and strong adhesion is formed.

A third solution is provided in the present invention. A front-side conductive paste for a crystalline silicon solar cell includes, based on 100 parts by weight, metal powder 80.0-93.0 parts, organic carrier 6.0-15.0 parts, and oxide etching agent 1.0-5.0 parts. Optionally, the metal powder of 80.0-83.0 parts is used. Optionally, the metal powder of 83.0-86.0 parts is used. Optionally, the metal powder of 86.0-89.0 parts is used. Optionally, the metal powder of 89.0-91.5 parts is used. Optionally, the metal powder of 91.5-93.0 parts is used. Optionally, the organic carrier of 6.0-7.0 parts is used. Optionally, the organic carrier of 7.0-8.5 parts is used. Optionally, the organic carrier of 8.5-10.0 parts is used. Optionally, the organic carrier of 10.0-11.0 parts is used. Optionally, the organic carrier of 11.0-12.0 parts is used. Optionally, the organic carrier of 12.0-13.0 parts is used. Optionally, the organic carrier of 13.0-15.0 parts is used. Optionally, the oxide etching agent of 1.0-2.0 parts is used. Optionally, the oxide etching agent of 2.0-3.0 parts is used. Optionally, the oxide etching agent of 3.0-4.0 parts is used. Optionally, the oxide etching agent of 4.0-5.0 parts is used. Optionally, based on 100% by mole of the oxide etching agent, the oxide etching agent includes at least 15-30% of PbO, 25-40% of TeO, 8-15% of $Li_2O$, 0.1-10% of CaO, and 5-15% of $Bi_2O_3$. More specifically, based on 100% by mole of the oxide etching agent, the oxide etching agent includes: PbO 15-30%; $TeO_2$ 25-40%; $Li_2O$ 8.0-15.0%; $SiO_2$ 9.0-20.0%; $Bi_2O_3$ 5.0-15.0%; ZnO 0.5-10.0%; CaO 0.1-10.0%; and oxide of additional elements 0-5.0%. Optionally, the oxide etching agent based on 100% by mole includes 15-17% of PbO. Optionally, the oxide etching agent based on 100% by mole includes 17-20% of PbO. Optionally, the oxide etching agent based on 100% by mole includes 20-24% of PbO. Optionally, the oxide etching agent based on 100% by mole includes 24-26% of PbO. Optionally, the oxide etching agent based on 100% by mole includes 26-28% of PbO. Optionally, the oxide etching agent based on 100% by mole includes 28-30% of PbO. Optionally, the oxide etching agent based on 100% by mole includes 25-30% of $TeO_2$. Optionally, the oxide etching agent based on 100% by mole includes 30-33% of $TeO_2$. Optionally, the oxide etching agent based on 100% by mole includes 33-36% of $TeO_2$. Optionally, the oxide etching agent based on 100% by mole includes 36-38% of $TeO_2$. Optionally, the oxide etching agent based on 100% by mole includes 38-40% of $TeO_2$. Optionally, the oxide etching agent based on 100% by mole includes 8-9% of $Li_2O$. Optionally, the oxide etching agent based on 100% by mole includes 9-10% of $Li_2O$. Optionally, the oxide etching agent based on 100% by mole includes 10-11% of $Li_2O$. Optionally, the oxide etching agent based on 100% by mole includes 11-12% of $Li_2O$. Optionally, the oxide etching agent based on 100% by mole includes 12-13% of $Li_2O$. Optionally, the oxide etching agent based on 100% by mole includes 13-14% of $Li_2O$. Optionally, the oxide etching agent based on 100% by mole includes 14-15% of $Li_2O$. Optionally, the oxide etching agent based on 100% by mole includes 9-11% of $SiO_2$. Optionally, the oxide etching agent based on 100% by mole includes 11-13% of $SiO_2$. Optionally, the oxide etching agent based on 100% by mole includes 13-15% of $SiO_2$. Optionally, the oxide etching agent based on 100% by mole includes 15-16% of $SiO_2$. Optionally, the oxide etching agent based on 100% by mole includes 16-18% of $SiO_2$. Optionally, the oxide etching agent based on 100% by mole includes 18-20% of $SiO_2$. Optionally, the oxide etching agent based on 100% by mole includes 5-6% of $Bi_2O_3$. Optionally, the oxide etching agent based on 100% by mole includes 6-8% of $Bi_2O_3$. Optionally, the oxide etching agent based on 100% by mole includes 8-10% of $Bi_2O_3$. Optionally, the oxide etching agent based on 100% by mole includes 10-12% of $Bi_2O_3$. Optionally, the oxide etching agent based on 100% by mole includes 12-14% of $Bi_2O_3$. Optionally, the oxide etching agent based on 100% by mole includes 14-15% of $Bi_2O_3$. Optionally, the oxide etching agent based on 100% by mole includes 0.5-0.6% of ZnO. Optionally, the oxide etching agent based on 100% by mole includes 0.6-0.8% of ZnO. Optionally, the oxide etching agent based on 100% by mole includes 0.8-1.1% of ZnO. Optionally, the oxide etching agent based on 100% by mole includes 1.1-2.2% of ZnO. Optionally, the oxide etching agent based on 100% by mole includes 2.2-3.3% of ZnO. Optionally, the oxide etching agent based on 100% by mole includes 3.3-5.0% of ZnO. Optionally, the oxide etching agent based on 100% by mole includes 5.0-6.5% of ZnO. Optionally, the oxide etching agent based on 100% by mole includes 6.5-7.5% of ZnO. Optionally, the oxide etching agent based on 100% by mole includes 7.5-8.6% of ZnO. Optionally, the oxide etching agent based on 100% by mole includes 8.6-10.0% of ZnO. Optionally, the oxide etching agent based on 100% by mole includes 0.1-0.2% of CaO. Optionally, the oxide etching agent based on 100% by mole includes 0.2-0.3% of CaO. Optionally, the oxide etching agent based on 100% by mole includes 0.3-0.5% of CaO. Optionally, the oxide etching agent based on 100% by mole includes 0.5-0.7% of CaO. Optionally, the oxide etching agent based on 100% by mole includes 0.7-1.0% of CaO. Optionally, the oxide etching agent based on 100% by mole includes 1.0-2.2% of CaO. Optionally, the oxide etching agent based on 100% by mole includes 2.2-3.5% of CaO. Optionally, the oxide etching agent based on 100% by mole includes 3.5-5.0% of CaO. Optionally, the oxide etching agent based on 100% by mole includes 5.0-6.5% of CaO. Optionally, the oxide etching agent based on 100% by mole includes 6.5-7.5% of CaO. Optionally, the oxide etching agent based on 100% by mole includes 7.5-9.0% of CaO. Optionally, the oxide etching agent based on 100% by mole includes 9.0-10.0% of CaO.

In the third solution of the present invention, CaO and $Li_2O$, and CaO and $Bi_2O_3$ are both present at a particular molar ratio in the oxide etching agent, and specifically $CaO:Li_2O=0.5:15-10:8$, and $CaO:Bi_2O_3=0.5:15-10:5$. The oxide etching agent is melted to form a liquid during the sintering process, so that a sufficient amount of silver is dissolved therein. One portion of the liquid oxide etching agent in which the silver is dissolved is used to wet the metal powder and facilitate the sintering of the metal powder. The other portion of the liquid oxide etching agent in which the silver is dissolved flows to the surface of the solar cell and reacts with the anti-reflective layer, so that the anti-reflective layer is effectively etched. During the cooling process after sintering, the liquid oxide etching agent is deposited on the silicon substrate as a high resistivity solid layer, the silver dissolved in the liquid oxide etching agent is precipitated out to form fine silver nanoparticles which is distributed in the high resistivity solid layer of the oxide etching agent, which allows the metal powder to form a good ohmic contact with the silicon, thus reducing the resistance. In this way, a front-side electrode with low contact resistance, good electrical conductivity and strong adhesion is formed.

In the three parallel technical solutions, the additional element in the oxide of the additional element is one or two or more of titanium, aluminum, silver, chromium, scandium, copper, niobium, vanadium, sodium, tantalum, strontium, bromine, cobalt, hafnium, lanthanum, yttrium, ytterbium, iron, barium, manganese, tungsten, nickel, tin, arsenic, zirconium, potassium, phosphorus, indium, gallium, and germanium.

The oxide etching agent in the three solutions of the present invention includes not only an oxide prepared by a chemical method and an oxide obtained by a high-temperature treatment, but also a carbonate, a phosphate, and a fluoride containing a cation, etc. For example, the lithium oxide $Li_2O$ may be replaced by $Li_2CO_3$.

Preferably, in the three parallel solutions, the oxide etching agent may be crystalline, amorphous, or a mixture of amorphous and crystalline.

In the three parallel solutions, the same metal powder and organic carrier may be used.

Optionally, the metal powder is particles of at least one metal element of silver, gold, platinum, copper, iron, nickel, zinc, titanium, cobalt, chromium, aluminum, manganese, palladium, and rhodium.

Optionally, the metal powder is silver-coated particles. Each particle is at least one metal element of copper, iron, nickel, zinc, titanium, cobalt, chromium, aluminum, and manganese, coated by a silver layer of a thickness in a range of 10-50 nm.

Optionally, the metal powder is a mixture of a non-silver-coated metal powder and a silver-coated metal powder, where a weight ratio of the non-silver coated metal powder to the silver-coated metal powder is 5/95-95/5. The non-silver-coated metal powder includes at least one metal element of silver, gold, platinum, copper, iron, nickel, zinc, titanium, cobalt, chromium, aluminum, manganese, palladium, and rhodium, the silver-coated metal powder includes at least one metal element of copper, iron, nickel, zinc, titanium, cobalt, chromium, aluminum, and manganese. Particles of the silver-coated metal powder includes a silver coating with a thickness in a range of 10-200 nm.

The organic carrier mentioned in the present invention includes an organic solvent, a polymer, a wetting dispersant, a thixotropic agent, and an additional functional additive.

Based on 100 parts by weight of the organic carrier, the organic carrier includes 50-95 parts of the organic solvent; 1-40 parts of the polymer; 0.1-10 parts of the wetting dispersant; and 1-20 parts of the thixotropic agent. Optionally, based on 100 parts by weight, 50-55 parts of the organic solvent is used. Optionally, based on 100 parts by weight, 55-60 parts of the organic solvent is used. Optionally, based on 100 parts by weight, 60-71 parts of the organic solvent is used. Optionally, based on 100 parts by weight, 71-77 parts of the organic solvent is used. Optionally, based on 100 parts by weight, 77-82 parts of the organic solvent is used. Optionally, based on 100 parts by weight, 82-85 parts of the organic solvent is used. Optionally, based on 100 parts by weight, 85-88 parts of the organic solvent is used. Optionally, based on 100 parts by weight, 88-90 parts of the organic solvent is used. Optionally, based on 100 parts by weight, 90-92 parts of the organic solvent is used. Optionally, based on 100 parts by weight, 92-94 parts of the organic solvent is used. Optionally, based on 100 parts by weight, 94-95 parts of the organic solvent is used. Optionally, based on 100 parts by weight, 1-2 parts of the polymer is used. Optionally, based on 100 parts by weight, 2-3 parts of the polymer is used. Optionally, based on 100 parts by weight, 3-5 parts of the polymer is used. Optionally, based on 100 parts by weight, 5-8 parts of the polymer is used. Optionally, based on 100 parts by weight, 8-12 parts of the polymer is used. Optionally, based on 100 parts by weight, 12-18 parts of the polymer is used. Optionally, based on 100 parts by weight, 18-25 parts of the polymer is used. Optionally, based on 100 parts by weight, 25-34 parts of the polymer is used. Optionally, based on 100 parts by weight, 34-37 parts of the polymer is used. Optionally, based on 100 parts by weight, 37-40 parts of the polymer is used. Optionally, based on 100 parts by weight, 0.1-0.2 parts of the wetting dispersant is used. Optionally, based on 100 parts by weight, 0.2-0.3 parts of the wetting dispersant is used. Optionally, based on 100 parts by weight, 0.3-0.4 parts of the wetting dispersant is used. Optionally, based on 100 parts by weight, 0.4-0.6 parts of the wetting dispersant is used. Optionally, based on 100 parts by weight, 0.6-0.9 parts of the wetting dispersant is used. Optionally, based on 100 parts by weight, 0.9-1.2 parts of the wetting dispersant is used. Optionally, based on 100 parts by weight, 1.2-2.2 parts of the wetting dispersant is used. Optionally, based on 100 parts by weight, 2.2-4.2 parts of the wetting dispersant is used. Optionally, based on 100 parts by weight, 4.2-5.5 parts of the wetting dispersant is used. Optionally, based on 100 parts by weight, 5.5-6.5 parts of the wetting dispersant is used. Optionally, based on 100 parts by weight, 6.5-7.8 parts of the wetting dispersant is used. Optionally, based on 100 parts by weight, 7.8-9.0 parts of the wetting dispersant is used. Optionally, based on 100 parts by weight, 9.0-1.0 parts of the wetting dispersant is used. Optionally, based on 100 parts by weight, 1-2 parts of the thixotropic agent is used. Optionally, based on 100 parts by weight, 2-3 parts of the thixotropic agent is used. Optionally, based on 100 parts by weight, 3-4 parts of the thixotropic agent is used. Optionally, based on 100 parts by weight, 4-6 parts of the thixotropic agent is used. Optionally, based on 100 parts by weight, 6-9 parts of the thixotropic agent is used. Optionally, based on 100 parts by weight, 9-12 parts of the thixotropic agent is used. Optionally, based on 100 parts by weight, 12-15 parts of the thixotropic agent is used. Optionally, based on 100 parts by weight, 15-17 parts of the thixotropic agent is used. Optionally, based on 100 parts by weight, 17-18 parts of the thixotropic agent is used. Optionally, based on 100 parts by weight, 18-20 parts of the thixotropic agent is used.

The organic solvent is at least one selected from terpineol, ethylene glycol butyl ether acetate, ethylene glycol ethyl ether acetate, a dodecanol ester, diethylene glycol butyl ether, triethylene glycol butyl ether, tripropylene glycol methyl ether, a terpene, and other high-boiling point solvents.

The polymer is at least one selected from ethyl cellulose, methyl cellulose, cellulose and a derivative thereof, an acrylic resin, an alkyd resin, and a polyester resin.

The wetting dispersant is one or two or more selected from a fatty acid (e.g. oleic acid and stearic acid), an amide derivative of a fatty acid (e.g. oleamide, and stearamide), an ester derivative of a fatty acid, polyethylene wax, and polyethylene glycol, which mainly functions to disperse the inorganic powder in the organic carrier.

The thixotropic agent is one or two or more selected from a hydrogenated castor oil derivative, polyamide wax, polyurea, and fumed silica, and mainly functions to increase the thixotropy of the paste during the printing process, so that the consistency of the silver paste becomes smaller when sheared during the printing process, and it is easy to perform screen printing; and when the shearing is stopped, the consistency is increased to ensure that the electrode has an excellent aspect ratio.

Further, the organic carrier may also include a functional additive in an amount of 0.1-20 parts by weight. Based on 100 parts by weight of the organic carrier, the functional additive optionally includes 0.1-0.2 parts. Optionally, the functional additive includes 0.2-0.3 parts. Optionally, the functional additive includes 0.3-0.5 parts. Optionally, the functional additive includes 0.5-0.7 parts. Optionally, the functional additive includes 0.7-1.0 parts. Optionally, the functional additive includes 1.0-2.0 parts. Optionally, the functional additive includes 2.0-5.0 parts. Optionally, the functional additive includes 5.0-10.0 parts. Optionally, the functional additive includes 10.0-15.0 parts. Optionally, the functional additive includes 15.0-20.0 parts. Optionally, the functional additive is one or two or more chemical species selected from poly (methylphenyl) siloxane, polyphenylsiloxane, a phthalate (e.g. diethyl phthalate, and dibutyl phthalate), micro-crystalline wax, polydimethylsiloxane, polyvinylbutyral (PVB), a polyether- and polyester-modified organosiloxane, and an alkyl-modified organosiloxane. The additional functional additive may be optionally added, for example, micro-crystalline wax is added to reduce the surface tension, dibutyl phthalate (DBP) is added to improve the flexibility of the paste, and polyvinylbutyral (PVB) is added to improve the adhesion.

As shown in FIG. 1, a method for preparing a front-side conductive paste for a crystalline silicon solar cell according to the present invention includes the following steps:

S01. Preparation of oxide etching agent: Raw materials of the oxide etching agent are weighed according to the raw material proportion in any one of the above three solutions and uniformly mixed; the uniformly mixed raw materials of the oxide etching agent are placed in a oven and heated to 900-1100° C. for 60-180 min, to obtain a melted liquid oxide etching agent; the melted liquid oxide etching agent is quenched, to obtain a particulate oxide etching agent; the particulate oxide etching agent is dried at a temperature of 60-80° C.; and the dried particulate oxide etching agent is crushed to obtain a powdered oxide etching agent having a particle size of 0.5-5.0 μm, which is then dried in a drying oven at 80-100° C. to obtain a dried powdered oxide etching agent.

Optionally, the quenching method includes cooling the melted liquid oxide etching agent by pouring it into water at 5-25° C. or cooling in flowing cold air at room temperature, where the temperature of the flowing cold air is at 25° C. or below.

The above-mentioned crushing of the particulate oxide etching agent may be performed by ball milling in a ball miller, or by other methods to make the particle size of the oxide etching agent smaller.

S02. Preparation of organic carrier: Raw materials of the organic carrier are sequentially weighed according to the weight proportion of the raw materials of the organic carrier as described above, and the weighed raw materials of the organic carrier are placed in a container, and mixed by stirring at a temperature of 40-100° C. for 100-160 min to obtain an organic carrier.

S03. Preparation of front-side conductive paste: The metal powder is mixed with the above prepared oxide etching agent and organic carrier, and ground to obtain front-side conductive silver paste.

An alternative method for preparing a front-side conductive paste for a crystalline silicon solar cell according to the present invention is also provided.

In an embodiment, the oxide etching agent and the metal powder are first mixed to obtain a first mixture, and then the first mixture is mixed with the organic carrier, and ground to obtain the front-side conductive paste for a crystalline silicon solar cell.

In another embodiment, the oxide etching agent and the organic carrier are first mixed to obtain a first mixture, and then the metal powder is added to the first mixture, and ground to obtain the front-side conductive paste for a crystalline silicon solar cell.

In still another embodiment, the metal powder and organic carrier are first mixed to obtain a first mixture, and then the oxide etching agent is added to the first mixture, and ground to obtain the front-side conductive paste for a crystalline silicon solar cell.

In a further embodiment, the amounts of the metal powder, organic carrier, and oxide etching agent are respectively taken as 100 parts by weight; and 20-60 parts by weight of the metal powder and 20-60 parts by weight of the organic carrier are first mixed to obtain a first mixture, then 40-80 parts by weight of the oxide etching agent is mixed with a part of the organic carrier to obtain a second mixture, and then the first mixture is mixed with the second mixture, and ground to obtain the front-side conductive paste for a crystalline silicon solar cell.

Figure 2:
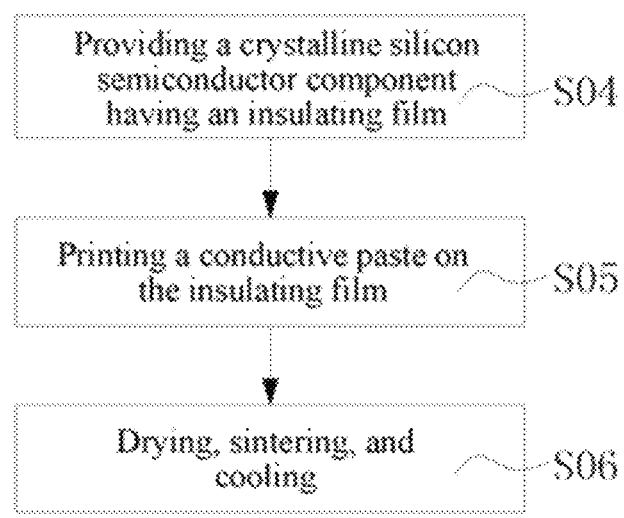
FIG. 2 is a schematic flowchart of a method for fabricating a front-side electrode of a crystalline silicon solar cell provided in the present disclosure.
Figure 3:
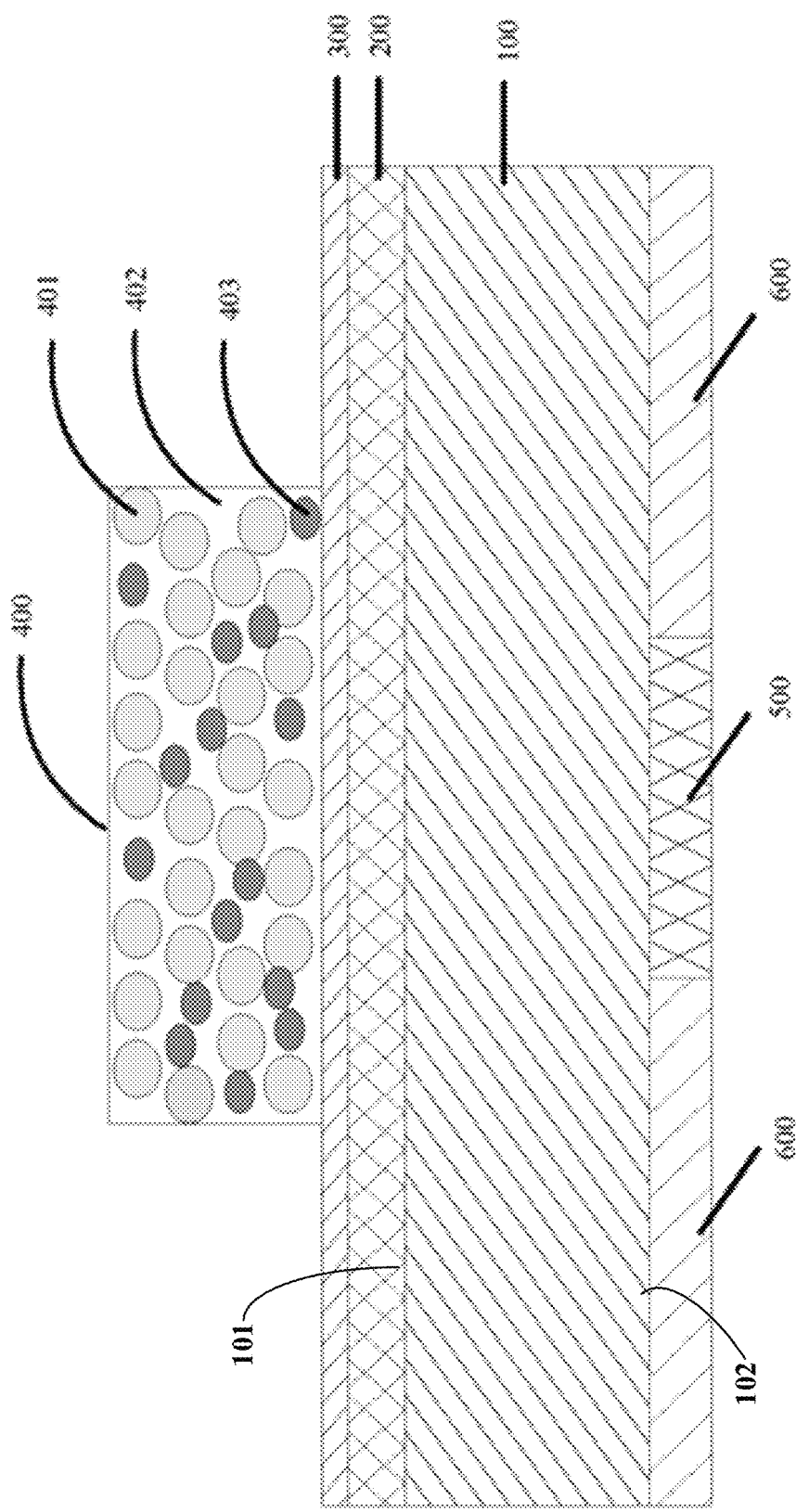
FIG. 3 is a schematic diagram showing a crystalline silicon substrate having a surface provided with an insulating film, on which a front-side conductive paste according to the present disclosure is printed.
Figure 4:
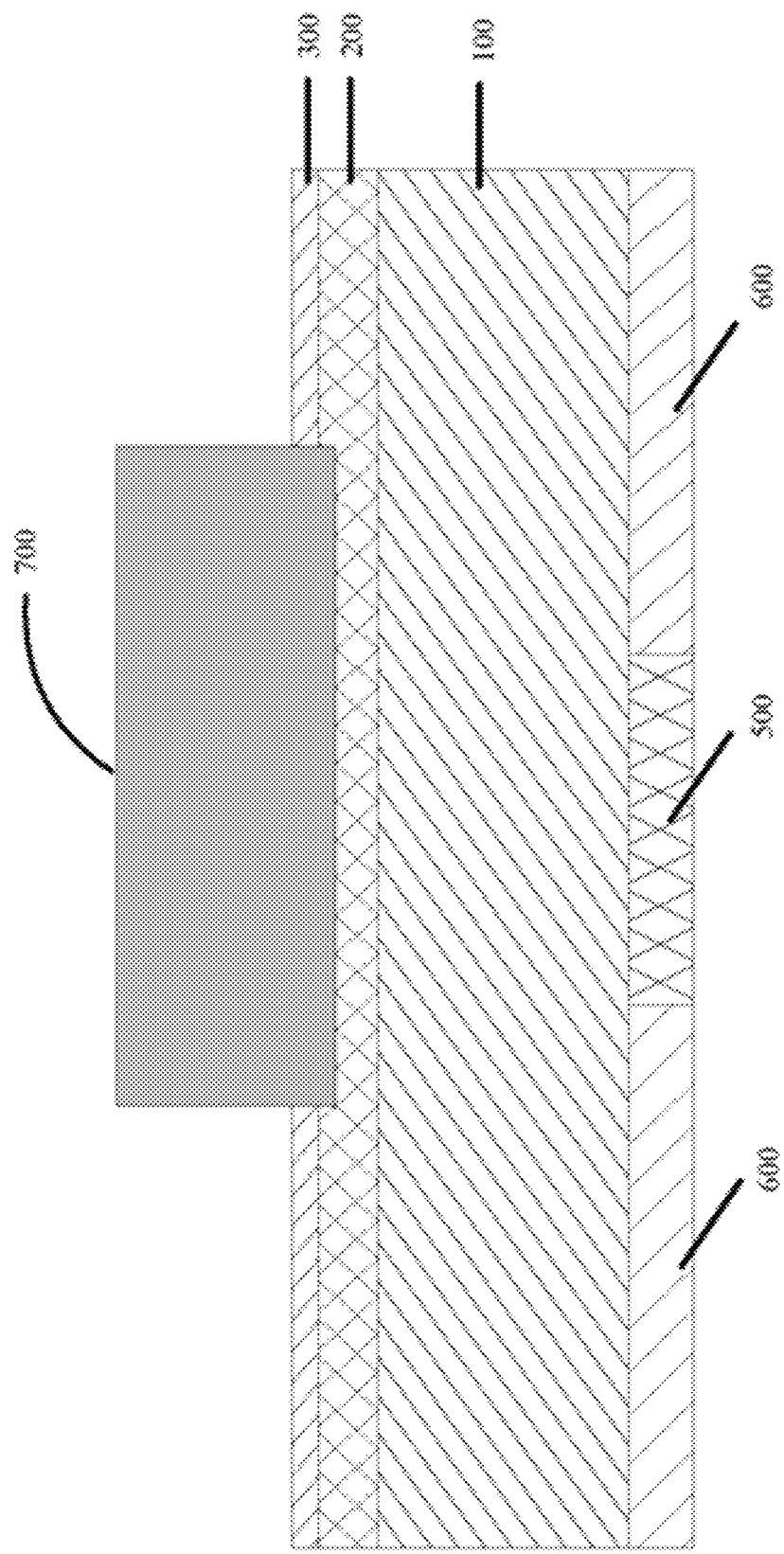
FIG. 4 is a schematic diagram showing the sintered crystalline silicon substrate printed with a front-side and a back-side paste shown in FIG. 3 in the present disclosure.

Referring to FIG. 2, FIG. 3 and FIG. 4, the present invention further provides a method for fabricating a front-side electrode of a crystalline silicon solar cell.

In the fabrication method, a crystalline silicon substrate has a surface having an insulating film deposited, as shown in FIG. 3. Referring to FIG. 3, a crystalline silicon chip 100 having a first surface 101 and a second surface 102 opposing to each other. On the first surface 101, a P/N junction layer 200 and an insulating film 300 are sequentially and outwardly laminated. On the second surface 102, a back-side silver paste 500 and a back-side aluminum paste 600 are printed. Optionally, the insulating film 300 may be deposited with at least one of a silicon nitride film, a titanium oxide film, an aluminum oxide film, and a silicon oxide film.

Specifically, the method for fabricating a front-side electrode of a crystalline silicon solar cell includes at least the following steps:

Step S04: A crystalline silicon substrate having an insulating film 300 deposited on its surface is provided.

Step S05: A front-side conductive paste 400 for a crystalline silicon solar cell (where 401 is a metal powder, 402 is an organic carrier, and 403 is an oxide etching agent) according to any one of the above solutions is printed on a surface of the insulating film 300.

Step S06: The crystalline silicon substrate treated in the step S05 is sequentially dried, sintered, and cooled to obtain a front-side electrode 700 of a crystalline silicon solar cell.

Specifically, the drying temperature is 80-400° C., the sintering temperature is 700-820° C., and the cooling is natural cooling (in flowing air at room temperature).

The present invention further provides a crystalline silicon solar cell employing a front-side electrode of a crystalline silicon solar cell as described above.

In order to better illustrate the front-side conductive paste for a crystalline silicon solar cell and the preparation method therefor provided in the embodiments of the present invention, the present invention is further described by way of examples hereinafter.

Example 1

A front-side conductive paste for a crystalline silicon solar cell includes, based on 100 parts by weights, 88.0 parts of a silver powder; 9.0 parts of an organic carrier; and 3.0 parts of an oxide etching agent.

Based on 100% by mole of the oxide etching agent, the oxide etching agent includes: 22% of PbO, 30% of $TeO_2$, 9.0% of $Li_2O$, 18.0% of $SiO_2$, 10.0% of $Bi_2O_3$, 10% of MgO, 0.5% of ZnO, and 0.5% of CaO.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.0 parts of the silver powder, 9.0 parts of the organic carrier and 3.0 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

Figure 5:
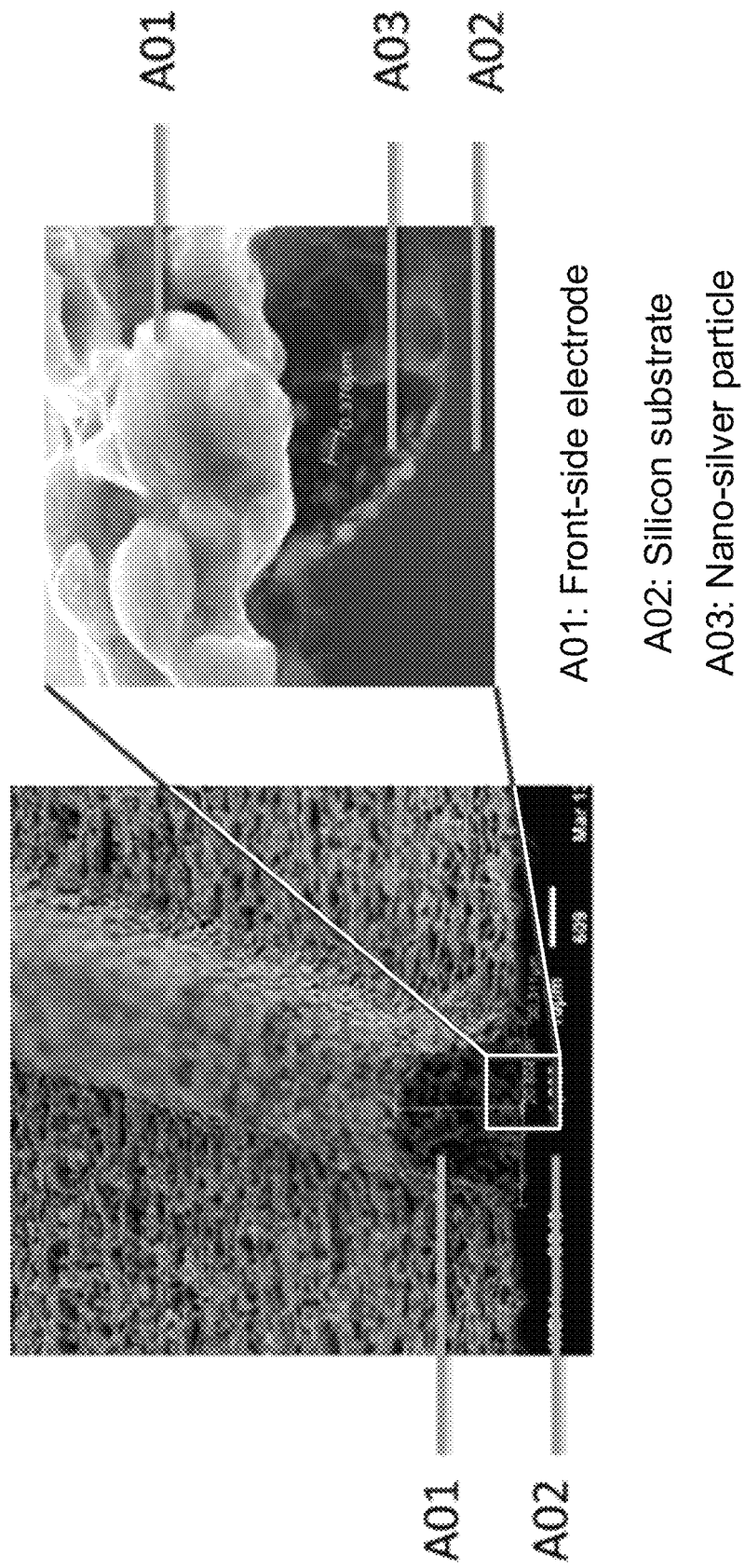
FIG. 5 is an exemplary electro microscopic image showing front-side electrode forming good contact with silicon according to an embodiment of the present disclosure.

The front-side conductive paste for a crystalline silicon solar cell obtained in Example 1 is printed by screen printing on a front side of a silicon substrate of a crystalline silicon solar cell having an insulating film, where a back side of the substrate is screen printed with a back-side silver paste and a back-side aluminum paste. Then, the silicon solar cell is sintered at 770° C. to form a front-side electrode of the crystalline silicon solar cell as shown in FIG. 5. During the sintering, the organic carrier in the front-side conductive paste is evaporated, the oxide etching agent in the front-side conductive paste is melted to form a liquid to contact with the silver powders, so that a sufficient amount of silver is dissolved therein. One portion of the liquid oxide etching agent in which the silver is dissolved is used to wet the metal powder and facilitate the sintering of the metal powders. The other portion of the liquid oxide etching agent in which the silver is dissolved flows to the surface of the solar cell and reacts with the anti-reflective layer, so that the anti-reflective layer is effectively etched. During the cooling process after sintering, the liquid oxide etching agent is deposited on the silicon substrate A02 as a high-resistivity solid layer (an insulation film), the silver dissolved in the liquid oxide etching agent is precipitated out to form fine silver nanoparticles A03 which are distributed in the high-resistivity solid layer of the oxide etching agent, which allow a good ohmic contact to form between metal in the paste with the silicon substrate A02, thus reducing the resistance and enhancing current flow for the silicon solar cell. In this way, a front-side electrode A01 with low contact resistance, good electrical conductivity, and strong adhesion is formed for the silicon solar cell.

The efficiency of the obtained silicon solar cell chip is tested, and the I-V test results are summarized in Table 1.

Example 2

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes: 30% of PbO, 25% of $TeO_2$, 15% of $Li_2O$, 9.0% of $SiO_2$, 5.0% of $Bi_2O_3$, 4.0% of MgO, 2.0% of ZnO, and 10% of CaO.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps:

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 2 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 3

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 25% of PbO, 20.5% of $TeO_2$, 13% of $Li_2O$, 9.5% of $SiO_2$, 12% of $Bi_2O_3$, 3.0% of MgO, 10% of ZnO, and 7.0% of CaO.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 3 is printed by screen printing on a front side of a crystalline silicon solar cell having an insulating film, where a back side of the solar cell is screen printed with a back-side silver paste and a back-side aluminum paste. Then, the solar cell is sintered at 780° C. to obtain a front-side electrode of the crystalline silicon solar cell.

The efficiency of the obtained silicon solar cell chip is tested, and the I-V test results are summarized in Table 1.

Example 4

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 22.9% of PbO, 25% of $TeO_2$, 14% of $Li_2O$, 15% of $SiO_2$, 14% of $Bi_2O_3$, 8.0% of MgO, 0.5% of ZnO, 0.1% of CaO, and 0.5% of $Al_2O_3$.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 4 is printed by screen printing on a front side of a crystalline silicon solar cell having an insulating film, where a back side of the solar cell is screen printed with a back-side silver paste and a back-side aluminum paste. Then, the solar cell is sintered at 780° C. to obtain a front-side electrode of the crystalline silicon solar cell.

The efficiency of the obtained silicon solar cell chip is tested, and the I-V test results are summarized in Table 1.

Example 5

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 25% of PbO, 30% of $TeO_2$, 8.0% of $Li_2O$, 10% of $SiO_2$, 10.0% of $Bi_2O_3$, 6.0% of MgO, 5.5% of ZnO, 5.0% of CaO, and 0.5% of $TiO_2$.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste for a crystalline silicon solar cell obtained in Example 5 is printed by screen printing on a front side of a crystalline silicon solar cell having an insulating film, where a back side of the solar cell is screen printed with a back-side silver paste and a back-side aluminum paste. Then, the solar cell is sintered at 790° C. to obtain a front-side electrode of the crystalline silicon solar cell.

The efficiency of the obtained silicon solar cell chip is tested, and the I-V test results are summarized in Table 1.

Example 6

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 24% of PbO, 25% of $TeO_2$, 9% of $Li_2O$, 15% of $SiO_2$, 15% of $Bi_2O_3$, 0.1% of MgO, 0.9% of ZnO, 10% of CaO, 0.5% of $Al_2O_3$, and 0.5% of $TiO_2$.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 6 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 7

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 20% of PbO, 25% of $TeO_2$, 15% of $Li_2O$, 20% of $SiO_2$, 9% of $Bi_2O_3$, 0.5% of ZnO, 10% of CaO, and 0.5% of $TiO_2$.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 7 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 8

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 21% of PbO, 25% of $TeO_2$, 14% of $Li_2O$, 10.5% of $SiO_2$, 11% of $Bi_2O_3$, 8.0% of MgO, 10% of ZnO, and 0.5% of $Al_2O_3$.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 8 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 9

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 25% of PbO, 26% of $TeO_2$, 7% of $Li_2O$, 19.5% of $SiO_2$, 15% of $Bi_2O_3$, 0.3% of MgO, 7% of ZnO, and 0.2% of CaO.

The oxide etching agent is prepared as follows: Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 9 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 10

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 25% of PbO, 25% of TeO$_2$, 6.0% of Li$_2$O, 15% of SiO$_2$, 15% of Bi$_2$O$_3$, 2.0% of MgO, 5.0% of ZnO, 5.0% of CaO, 1.5% of Al$_2$O$_3$, and 0.5% of TiO$_2$.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 10 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 11

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 33% of PbO, 22% of TeO$_2$, 4% of Li$_2$O, 18% of SiO$_2$, 14% of Bi$_2$O$_3$, 5% of MgO, 3% of ZnO, and 1% of CaO.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 11 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 12

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 13.3% of PbO, 39% of TeO$_2$, 5% of Li$_2$O, 6.6% of SiO$_2$, 20% of Bi$_2$O$_3$, 13% of MgO, 3% of ZnO, and 0.1% of CaO.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 12 is printed by screen printing on a front side of a crystalline silicon solar cell having an insulating film, where a back side of the solar cell is screen printed with a back-side silver paste and a back-side aluminum paste. Then, the solar cell is sintered at 770° C. to obtain a front-side electrode of the crystalline silicon solar cell.

The efficiency of the obtained silicon solar cell chip is tested, and the I-V test results are summarized in Table 1.

Example 13

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 18.8% of PbO, 22% of $TeO_2$, 4% of $Li_2O$, 16% of $SiO_2$, 20% of $Bi_2O_3$, 16% of MgO, 3% of ZnO, and 0.2% of CaO.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 13 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell.

The efficiency of the obtained silicon solar cell chip is tested, and the I-V test results are summarized in Table 1.

Example 14

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 17.3% of PbO, 22% of $TeO_2$, 4% of $Li_2O$, 18.7% of $SiO_2$, 4% of $Bi_2O_3$, 16% of MgO, 3% of ZnO, and 15% of CaO.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 μm, which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 14 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell. The efficiency of the obtained silicon solar cell chip is tested, and the I-V test results are summarized in Table 1.

Example 15

A front-side conductive paste for a crystalline silicon solar cell includes, based on 100 parts by weights, 88.5 parts of a silver powder; 9.0 parts of an organic carrier; and 2.5 parts of an oxide etching agent.

Based on 100% by mole of the oxide etching agent, the oxide etching agent includes 18.8% of PbO, 22% of $TeO_2$, 7% of $Li_2O$, 12% of $SiO_2$, 20% of $Bi_2O_3$, 0.2% of MgO, 3% of ZnO, and 17% of CaO.

The oxide etching agent is prepared as follows. Raw materials of the oxide etching agent are weighed according to the above proportion and uniformly mixed; the uniformly mixed raw materials of the oxide etching agent are placed in a heater and heated to 1000° C. for 120 min, to obtain a melted liquid oxide etching agent; the melted liquid oxide etching agent is cooled by pouring into water at normal temperature (25° C.), to obtain a particulate oxide etching agent; the particulate oxide etching agent is dried in a drying oven at a temperature of 80° C.; and the dried particulate oxide etching agent is milled in a ball mill to obtain a powdered oxide etching agent having a particle size of 0.5-7.0 which is then dried in a drying oven at 100° C. to obtain a dried powdered oxide etching agent.

Based on 100% by weight of the organic carrier, the organic carrier includes 70% of a mixture of terpineol, a dodecanol ester, and a terpene; 10% of ethyl cellulose, 15% of rosin resin, and 5% of polyamide wax.

A method for preparing the front-side conductive paste for a crystalline silicon solar cell includes the following steps.

88.5 parts of the silver powder, 9.0 parts of the organic carrier and 2.5 parts of the oxide etching agent powder are weighed according to the above weight proportions, uniformly mixed and ground to obtain a front-side conductive paste for a crystalline silicon solar cell.

A method for fabricating a front-side electrode of a crystalline silicon solar cell includes the following steps.

The front-side conductive paste obtained in Example 15 is printed by screen printing on a front side of a crystalline silicon solar cell having an insulating film, where a back side of the solar cell is screen printed with a back-side silver paste and a back-side aluminum paste. Then, the solar cell is sintered at 800° C. to obtain a front-side electrode of the crystalline silicon solar cell. The efficiency of the obtained silicon solar cell chip is tested, and the I-V test results are summarized in Table 1.

Comparative Example

The front-side conductive paste PVM1B for a crystalline silicon solar cell widely available from the market is printed by screen printing on a front side of a crystalline silicon solar cell having the same insulating film as that in the examples, where a back side of the solar cell is screen printed with a back-side silver paste and a back-side aluminum paste. Then, the solar cell is sintered by heating to 800° C. to obtain a front-side electrode of the crystalline silicon solar cell. Then the efficiency of the silicon solar cell chip is tested, and the IV test results are summarized in Table 1.

Performance Tests (1) I-V Test

The silicon solar cell chips of Examples 1-15 and the solar cell chip of Comparative Example are subjected to an I-V test on a HALM IV tester, and the results are shown in Table 1.

(2) Tensile Test

Figure 6:
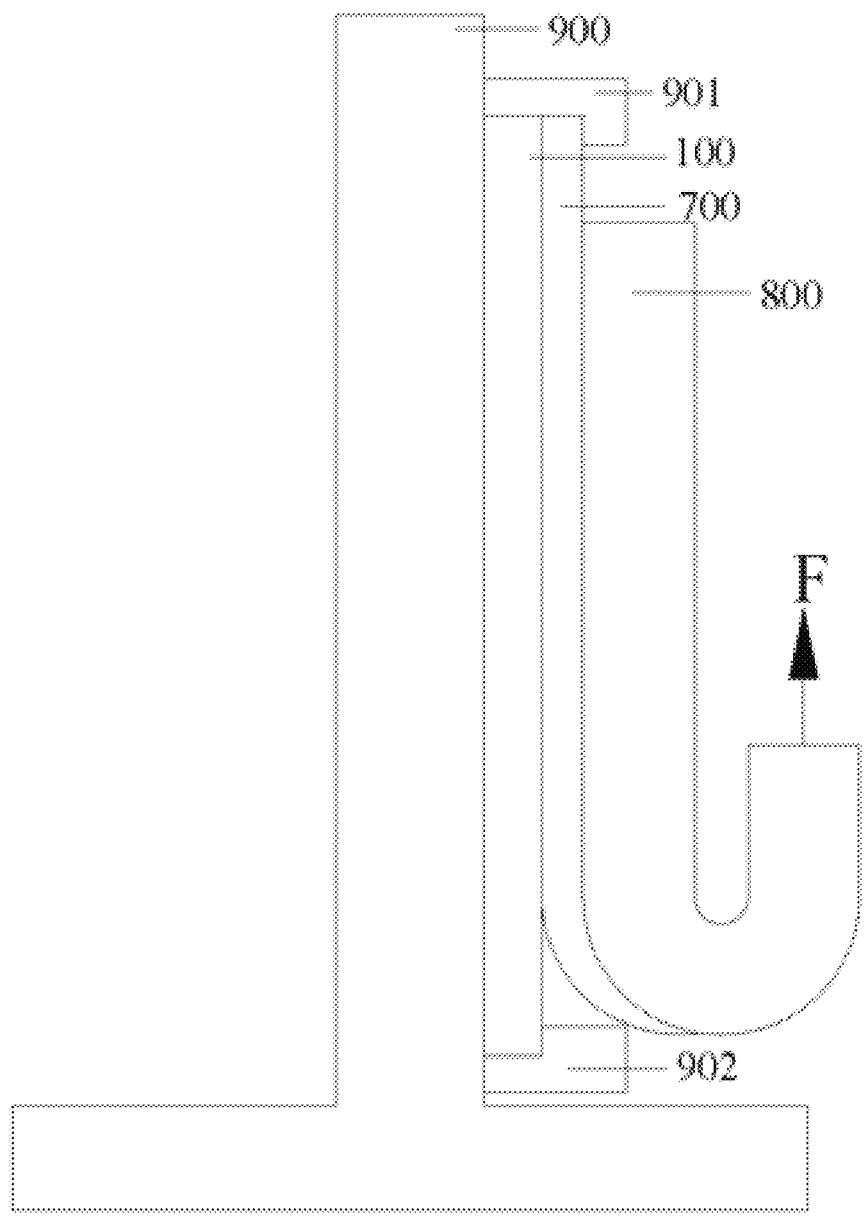
FIG. 6 is a schematic diagram showing a tensile test at 180 degrees.

A solder strip is soldered to a main grid and then a tensile test at 180 degrees is performed. The main grid is 0.7 mm wide, and a 0.9 mm-wide solder strip is soldered to the main grid. The solder strip is 0.9 mm wide, 0.23 mm thick and has a composition of 96.5% Sn and 3.5% Ag. FIG. 6 is a schematic diagram showing a tensile test at 180 degrees. Specifically, a solder strip 800 is first soldered to the surface of a main grid, and then the crystalline silicon cell chip 100 is fixed to a tensile tester 900 by using a first fixing bolt 901 and a second fixing bolt 902. The tensile test is performed in the direction of the tensile force F. The tensile test results are shown in Table 1.

As can be seen from Table 1, the conversion efficiency of the solar cells of Examples 1-8 is on average 18.46%, which is quite significant over the rate 18.12% achieved by the solar cell of Comparative Example. The conversion rate of Examples 9-15 is lower than that of the solar cell of Comparative Example. In Examples 1-15, the difference in conversion rate of the solar cells is mainly caused by the different oxide etching agents used, because the same silver powder and organic carrier are used in these examples. Alternatively, the series resistance ($R_S$) of the solar cells of Example 1-8 is (<0.002 Ohms) significantly lower than 0.01 Ohms of the solar cells of Comparative Example. This indicates that the electrical contact formed between the metal element and the silicon substrate or cell chip of the solar cell by applying the conductive paste based on Examples 1-8 over the insulation film on the silicon solar cell chip is significantly improved over the electrical contact by using conventional conductive paste.

The oxide etching agents of Examples 1-6 have better performance due to their unique proportions of oxide components, and the molar contents of the oxide are in the following ranges: PbO 15-30%, $TeO_2$ 25-40%, $Li_2O$ 8-15%, $SiO_2$ 9-20%, $Bi_2O_3$ 5-15%, MgO 0.1-8%, ZnO 0.5-10.0%, CaO 0.1-10.0%, and oxides of additional elements $Al_2O_3$ and $TiO_2$ 0-5.0%. The unique proportions of the oxide components allow the oxide etching agent to dissolve sufficient silver during the sintering process, which can fully etch the insulating layer on the surface of the cell chip without excessively etching the silicon cell chip, so that the silver electrode has not only good ohmic contact with, but also high adhesion to the silicon cell chip.

The oxide etching agent of Example 7 contains no MgO, but a amount of CaO, and also has good performance. The oxide etching agent of Example 8 contains no CaO, but a amount of MgO, and also has good performance.

The conversion rate of the solar cells of Examples 9-15 is lower than that of Comparative Example. The series resistance ($R_S$) of the solar cells of Example 9-15 is significantly higher because the molar proportions of the oxides used in the oxide etching agent is not in the optimum range. The oxide etching agent cannot effectively erode the insulating film on the silicon solar cell chip during the sintering

TABLE 1

Statistics of performance test data of crystalline silicon solar cells obtained in Examples 1-15 and in Comparative Example

| Scheme | Number | Uoc | Isc | FF | Eta | Rs | Rsh | IRev1 | Tensile force (N) |
|---|---|---|---|---|---|---|---|---|---|
| Example 1 | 16 pcs | 0.6292 | 8.9481 | 79.04 | 18.29 | 0.00177 | 100 | 0.29 | 4.3 |
| Example 2 | 16 pcs | 0.6288 | 8.9922 | 78.66 | 18.28 | 0.00190 | 95 | 0.35 | 4.4 |
| Example 3 | 16 pcs | 0.6287 | 8.9246 | 79.24 | 18.27 | 0.00175 | 84 | 0.48 | 3.9 |
| Example 4 | 16 pcs | 0.6278 | 8.9229 | 78.66 | 18.41 | 0.00186 | 39 | 0.65 | 4.4 |
| Example 5 | 16 pcs | 0.6320 | 9.0354 | 80.00 | 18.77 | 0.00151 | 211 | 0.14 | 5.0 |
| Example 6 | 16 pcs | 0.6317 | 9.0269 | 80.05 | 18.76 | 0.00140 | 100 | 0.33 | 2.8 |
| Example 7 | 16 pcs | 0.6295 | 9.0143 | 79.43 | 18.52 | 0.00142 | 84 | 0.29 | 4.3 |
| Example 8 | 16 pcs | 0.6292 | 8.9674 | 79.22 | 18.37 | 0.00151 | 93 | 0.31 | 4.3 |
| Example 9 | 16 pcs | 0.6301 | 8.8905 | 66.33 | 15.69 | 0.05336 | 223 | 0.23 | 5.6 |
| Example 10 | 16 pcs | 0.6101 | 8.8288 | 76.09 | 16.85 | 0.03060 | 456 | 0.16 | 5.4 |
| Example 11 | 16 pcs | 0.6302 | 8.8252 | 75.99 | 17.60 | 0.01959 | 104 | 0.24 | 5.5 |
| Example 12 | 16 pcs | 0.6305 | 8.8167 | 75.93 | 17.59 | 0.01953 | 80 | 0.38 | 5.5 |
| Example 13 | 16 pcs | 0.6301 | 8.8357 | 76.00 | 17.57 | 0.02025 | 174 | 0.18 | 2.9 |
| Example 14 | 16 pcs | 0.6296 | 8.8294 | 76.33 | 17.63 | 0.01994 | 265 | 0.13 | 4.1 |
| Example 15 | 16 pcs | 0.6283 | 8.8712 | 76.12 | 17.75 | 0.02050 | 194 | 0.21 | 4.9 |
| Comparative Example | 16 pcs | 0.6294 | 8.8866 | 76.92 | 18.12 | 0.002847 | 318 | 0.13 | 2.9 | process, and the front side silver electrode does not form a good contact with the silicon substrate.

Based on the present disclosure of the front-side conductive paste suggested in Examples 1-8, in yet another aspect, a crystalline silicon solar cell is provided. The crystalline silicon solar cell includes a crystalline silicon substrate and at least one insulation film deposited on the crystalline silicon substrate. The crystalline silicon solar cell further includes a front-side electrode in contact with the at least one insulation film and in electrical contact with the crystalline silicon substrate characterized by a series resistance no greater than 0.002 Ohms. Furthermore, the front-side electrode includes an electrically conductive metal powder, oxides of several metal elements including Pb, Te, Li, Bi, Si, Bi, at least 0.5-10 wt % ZnO, and either one or both of 0.1-10 wt % MgO and 0.1-10 wt % CaO.

The present invention has been described in detail with reference to preferred embodiments, which however are not intended to limit the present invention. Any modifications, equivalent substitutions and improvements can be made without departing from the spirit and principle of the present invention, which are all fall within the protection scope of the present invention.

What is claimed is:

1. A front-side conductive paste for a crystalline silicon solar cell, comprising, based on 100 parts by weight,
   80.0-93.0 parts of a metal powder;
   6.0-15.0 parts of an organic carrier;
   1.0-5.0 parts of an oxide etching agent wherein based on 100% by mole, the oxide etching agent comprises 15-30% of PbO; 25-40% of $TeO_2$ ; 8.0 -15.0% of $Li_2O$; 9.0-20.0% of $SiO_2$; 5.0-15.0% of $Bi_2O_3$; 0.5-10.0% of ZnO; and either one or both of 0.1-10.0% of MgO and 0.1-10.0% of CaO.

2. The conductive paste of claim 1, further comprises no more than 5% of an oxide of one or more elements selected from titanium, aluminum, silver, chromium, scandium, copper, niobium, vanadium, sodium, tantalum, strontium, bromine, cobalt, hafnium, lanthanum, yttrium, ytterbium, iron, barium, manganese, tungsten, nickel, tin, arsenic, zirconium, potassium, phosphorus, indium, gallium, and germanium.

3. The conductive paste of claim 1, wherein the oxide etching agent comprises particles in at least one state of crystalline and amorphous.

4. The conductive paste of claim 1, wherein the metal powder comprises particles of at least one element selected from silver, gold, platinum, copper, iron, nickel, zinc, titanium, cobalt, chromium, aluminum, manganese, palladium, and rhodium.

5. The conductive paste of claim 1, wherein the metal powder comprises particles of at least one element selected from copper, iron, nickel, zinc, titanium, cobalt, chromium, aluminum, and manganese, wherein each of the particles is coated by a silver layer having a thickness of 10-50 nm.

6. The conductive paste of claim 1, wherein the metal powder comprises a mixture of non-silver-coated particles and silver-coated particles with a weight ratio in a range from 5/95 to 95/5, wherein the non-silver-coated particles comprise at least one element selected from silver, gold, platinum, copper, iron, nickel, zinc, titanium, cobalt, chromium, aluminum, manganese, palladium, and rhodium, and the silver-coated particles comprise at least one element selected from copper, iron, nickel, zinc, titanium, cobalt, chromium, aluminum, and manganese, each of the silver-coated particles is coated by a silver layer having a thickness of 10 -200 nm.

7. The conductive paste of claim 1, wherein the organic carrier comprises, based on 100 parts, 50-95 parts of an organic solvent, 1-40 parts of a polymer, 0.1-10 parts of a wetting dispersant, 1-20 parts of a thixotropic agent, and 0.1-20 parts of a functional additive;
   wherein the organic solvent is at least one of terpineol, ethylene glycol butyl ether acetate, ethylene glycol ethyl ether acetate, a dodecanol ester, diethylene glycol butyl ether, triethylene glycol butyl ether, tripropylene glycol methyl ether, and a terpene;
   wherein the polymer is at least one selected from ethyl cellulose, methyl cellulose, cellulose and a derivative thereof, an acrylic resin, an alkyd resin, and a polyester resin;
   wherein the wetting dispersant is one or a mixture of one or two or more selected from a fatty acid, an amide derivative of a fatty acid, an ester derivative of a fatty acid, polyethylene wax, and polyethylene glycol;
   wherein the thixotropic agent is at least one selected from a hydrogenated castor oil derivative, polyamide wax, polyurea, and fumed silica;
   wherein the functional additive is one or two or more selected from poly (methylphenyl) siloxane, polyphenylsiloxane, a phthalate, diethyl phthalate, dibutyl phthalate, micro-crystalline wax, polydimethylsiloxane, polyvinylbutyral, a polyether- and polyester-modified organosiloxane, and an alkyl-modified organosiloxane.

8. A method for preparing a front-side conductive paste for a crystalline silicon solar cell, at least comprising:
   melting raw material of an oxide etching agent including 15-30% of PbO; 25-40% of $TeO_2$; 8.0-15.0% of $Li_2O$; 9.0-20.0% of $SiO_2$; 5.0-15.0% of $Bi_{12}O_3$; 0.5-10.0% of ZnO; and
   either one or both of 0.1-10.0% of MgO and 0.1-10.0% of CaO based on 100% by mole, to obtain a melted oxide etching agent;
   quenching the melted oxide etching agent into pure water at 5-25° C. to obtain a particulate oxide etching agent;
   crushing the particulate oxide etching agent to obtain a powdered oxide etching agent having particle size ranging from 0.1 to 5.0 μm;
   mixing raw materials of an organic carrier including 50-95 parts of an organic solvent, 1-40 parts of a polymer, 0.1-10 parts of a wetting dispersant, 1-20 parts of a thixotropic agent, and 0.1-20 parts of a functional additive based on 100 parts by weight, in an environment of 40-100° C., to obtain the organic carrier; and
   mixing a metal powder of 80.0-93.0 parts with the powdered oxide etching agent of 6.0-15.0 parts and the organic carrier of 1.0-5.0 parts based on 100 parts by weight, to obtain a front-side conductive paste for a crystalline silicon solar cell.

9. The method of claim 8, wherein the metal powder comprises particles of at least one element selected from copper, iron, nickel, zinc, titanium, cobalt, chromium, aluminum, and manganese, wherein each of the particles is coated by a silver layer having a thickness of 10-50 nm.

10. The method of claim 8, wherein the metal powder comprises a mixture of non-silver-coated particles and silver-coated particles with a weight ratio in a range from 5/95 to 95/5, wherein the non-silver-coated particles comprise at least one element selected from silver, gold, platinum, copper, iron, nickel, zinc, titanium, cobalt, chromium, aluminum, manganese, palladium, and rhodium, and the silver-coated particles comprise at least one element selected from copper, iron, nickel, zinc, titanium, cobalt, chromium, aluminum, and manganese, each of the silver-coated particles is coated by a silver layer having a thickness of 10-200 nm.

11. The method of claim 8, wherein the organic solvent is at least one of terpineol, ethylene glycol butyl ether acetate, ethylene glycol ethyl ether acetate, a dodecanol ester, diethylene glycol butyl ether, triethylene glycol butyl ether, tripropylene glycol methyl ether, and a terpene;
- wherein the polymer is at least one selected from ethyl cellulose, methyl cellulose, cellulose and a derivative thereof, an acrylic resin, an alkyd resin, and a polyester resin;
- wherein the wetting dispersant is one or a mixture of one or two or more selected from a fatty acid, an amide derivative of a fatty acid, an ester derivative of a fatty acid, polyethylene wax, and polyethylene glycol;
- wherein the thixotropic agent is at least one selected from a hydrogenated castor oil derivative, polyamide wax, polyurea, and fumed silica;
- wherein the functional additive is one or two or more selected from poly (methylphenyl) siloxane, polyphenylsiloxane, a phthalate, diethyl phthalate, dibutyl phthalate, micro-crystalline wax, polydimethylsiloxane, polyvinylbutyral, a polyether- and polyester-modified organosiloxane, and an alkyl-modified organosiloxane.

12. A method for fabricating a front-side electrode of a crystalline silicon solar cell, comprising:
- providing a crystalline silicon surface overlaid with an insulating film;
- printing the conductive paste of claim 1 overlying the insulating film;
- drying the conductive paste overlying the insulating film at a temperature in a range of 80-400° C.;
- sintering the conductive paste overlying the insulating film overlaid on the crystalline silicon surface at a temperature in a range of 700-820° C.;
- cooling the conductive paste overlying the insulating film overlaid on the crystalline silicon surface naturally in flowing air at room temperature.

13. The method of claim 12, wherein the insulating film comprises one of a silicon nitride film, a titanium oxide film, an aluminum oxide film, and a silicon oxide film.

* * * * *